United States Patent

Innes et al.

[11] Patent Number: 5,815,357
[45] Date of Patent: Sep. 29, 1998

[54] METHOD AND APPARATUS FOR THREE-PHASE SENSING USING TWO CURRENT TRANSFORMERS

[75] Inventors: Mark E. Innes; John H. Blakely, both of Asheville, N.C.

[73] Assignee: Eaton Corporation, Cleveland, Ohio

[21] Appl. No.: 831,621

[22] Filed: Apr. 9, 1997

[51] Int. Cl.[6] .................................................. H02H 3/00
[52] U.S. Cl. .............................. 361/93; 361/85; 361/87; 364/483
[58] Field of Search .................................. 361/93, 87, 31, 361/94, 96, 97, 99, 102, 85; 364/483, 488

[56] References Cited

U.S. PATENT DOCUMENTS

| | | | |
|---|---|---|---|
| 2,202,998 | 6/1940 | Seeger et al. | 172/289 |
| 3,604,982 | 9/1971 | McDonald | 317/18 R |
| 3,614,533 | 10/1971 | Douglas et al. | 317/18 D |
| 3,875,464 | 4/1975 | Gary et al. | 317/13 R |
| 4,574,229 | 3/1986 | Kim | 318/788 |
| 4,683,513 | 7/1987 | Miller | 361/76 |
| 4,683,515 | 7/1987 | Beihoff et al. | 361/106 |
| 4,879,626 | 11/1989 | Kim | 361/93 |
| 4,967,304 | 10/1990 | Dougherty | 361/31 |
| 5,113,304 | 5/1992 | Ozaki et al. | 361/87 |
| 5,220,478 | 6/1993 | Innes et al. | 361/93 |
| 5,239,438 | 8/1993 | Echtler | 361/44 |
| 5,450,268 | 9/1995 | Phillips et al. | 361/93 |
| 5,506,743 | 4/1996 | Phillips | 361/85 |
| 5,579,194 | 11/1996 | Mackenzie et al. | 361/24 |

*Primary Examiner*—Jeffrey A. Gaffin
*Assistant Examiner*—Michael J. Sherry
*Attorney, Agent, or Firm*—Whyte Hirschboeck Dudek, SC

[57] ABSTRACT

A method and apparatus is disclosed for complete three-phase sensing using two current transformers. Two phases of a three-phase system are used as the primary windings in each current transformer such that each current transformer produces a phasor representation of a sum of the two phases. A three phase sensor is provided to add the phasor representations produced by each of the current transformers and to produce a third phasor representation from the summation. The three phasor representations can then be applied to any conventional overload relay control to monitor each phase and produces a trip signal to open the three-phase system when a phasor representation exceeds some predetermined value, or the magnitudes of the phasors differ by more than a predefined value.

11 Claims, 1 Drawing Sheet

METHOD AND APPARATUS FOR THREE-PHASE SENSING USING TWO CURRENT TRANSFORMERS

BACKGROUND OF THE INVENTION

The present invention relates generally to phase sensing of alternating currents in a polyphase distribution system, and more particularly to a method and apparatus for three-phase sensing using two current transformers.

Current transformers (CTs) are used for sensing AC electrical currents in load control and in protection devices. For example, CTs are used in sensing electrical currents through contactors, motor starters and controllers, circuit breakers, monitors and analyzers, and in general, electrical distribution systems. In many such applications, these products are polyphase, or more particularly three-phase, and generally require a CT for each phase.

Most modern prior art attempts at monitoring overload and fault conditions in a load supplied by a multiphase, or polyphase power supply, use a current transformer for each separate phase of the three-phase power distribution system. For example, U.S. Pat. No. 4,967,304 discloses a digital circuit interrupter applicable for use on a three-phase power distribution system wherein a separate current transformer is required for each separate phase of the distribution system. One attempt at using two current transformers to detect phase failure and overload is disclosed in U.S. Pat. No. 2,202,998. However, the two CTs monitor only two of the three phases, and the third phase is only indirectly monitored. That is, a failure or overload on the unmonitored third phase is detected by the reaction it has on the two monitored phases. The third phase itself is not monitored. Further, a phase loss in the unmonitored phase will go undetected until the two CTs detect the resulting higher currents in the two monitored phases, which may be too late to protect modern loads having very tight thermal tolerances.

There is therefore a need for a method and apparatus for monitoring AC currents in a multiphase system using fewer CTs than the number of phases. Such a system would be particularly useful in low cost products where having a CT for each phase is cost prohibitive. Therefore, it would be desirable to have a method and apparatus for three-phase sensing using two current transformers that solves the aforementioned problems.

SUMMARY OF THE INVENTION

The present invention accomplishes the foregoing by providing a device for monitoring all three phases of a polyphase power supply with only two current transformers. The present invention reduces the cost associated with the current transformers by one-third from that of most commercially available overload devices using three such CTs, and reduces the overall cost of such devices by approximately 10%.

In accordance with one aspect of the invention, a device for monitoring a polyphase system connected to a load, for example a motor, has two current transformers, each one in operable association with two phases of the polyphase system. In this manner, each current transformer monitors two phases of the three phase system and thereby produces a phasor representation of the negative sum of the two phases monitored. The result of this summation, occurring in each current transformer, is the phasor representation of a third phase. A three phase sensor is connected to each of the current transformers for summing the phasor representations produced by each of the two current transformers to extract the third phasor representation.

The results can then be used in any conventional monitoring device to monitor each of the three phases. The device may produce a trip signal when a phasor representation is not within some predefined range, or a comparison of the magnitudes can be made to trip on any phase loss, unbalance or jam. For example, a thermal overload relay can be used wherein the three phasor representations are used to compute the RMS value for the current and integrate the RMS value to create a total heat accumulation value. After subtracting a cooling factor, a net heat accumulated value is produced which can then be compared to a set point. A trip signal is produced when the net heat exceeds the set point. In this manner, all three phases can be monitored with the two current transformer device. The present invention is equally applicable to such monitoring devices as meters and other measuring or monitoring apparatus.

In accordance with another aspect of the invention, a method of monitoring a polyphase system is also disclosed. The method includes detecting the current flow in each leg of a polyphase system, then creating a first phasor representation from the current flow in the first and second legs of the polyphase system and creating a second phasor representation from the current flow in the second and third legs of the polyphase system. The process next includes calculating a third phasor representation from the first and second phasor representations, and then monitoring each phasor representation. The method can also include preventing current flow in each leg in response to at least one of the phasor representations varying by more than a predetermined value, or one phasor value varying by more than a predetermined amount over that of another phasor.

Various other features, objects and advantages of the present invention will be made apparent from the following detailed description and the drawings.

BRIEF DESCRIPTION OF THE DRAWINGS

The drawings illustrate the best mode presently contemplated for carrying out the invention. In the drawings.

DETAILED DESCRIPTION OF THE INVENTION

The present invention is described herein in connection with a motor, a motor starter, and a thermal overload relay. However, it is understood that the application of the invention in this configuration is for illustration only, and it will be appreciated by those skilled in the art that the present invention is equally applicable to any load connected to a polyphase distribution system with an appropriate overload, fault detection, and/or metering control.

Figure 1:
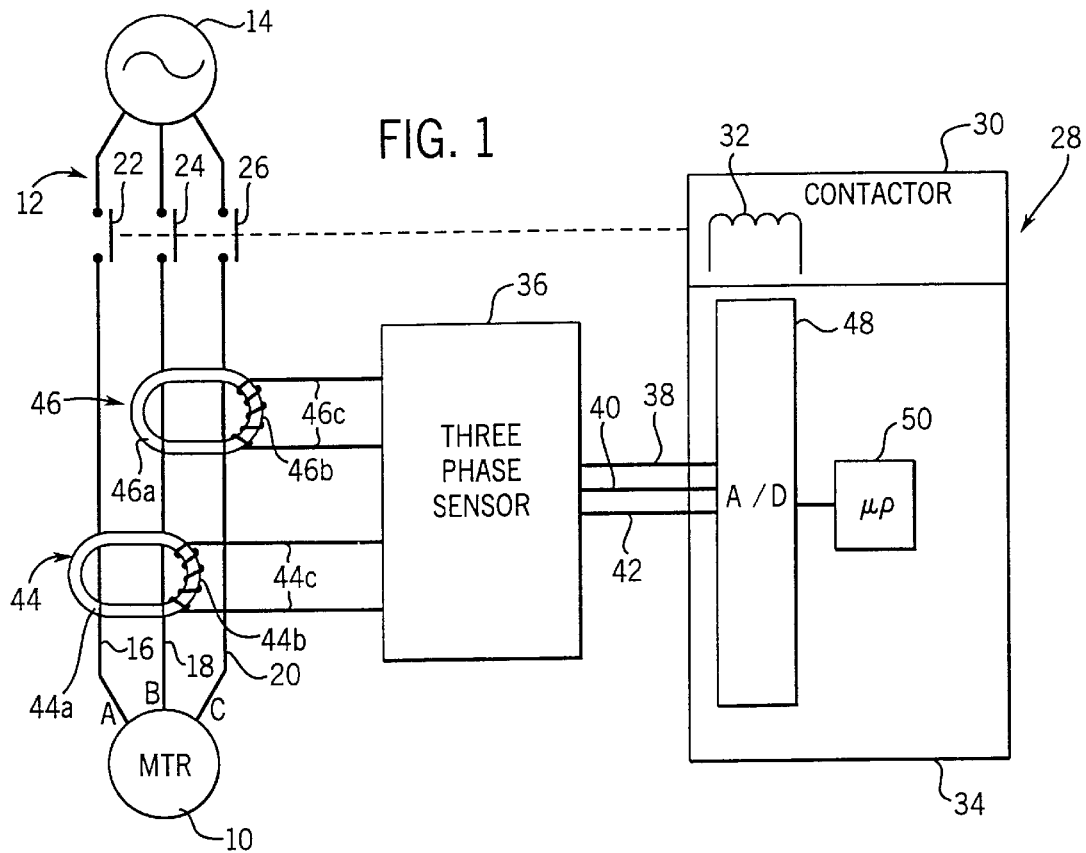
FIG. 1 is a schematic diagram of a motor starter incorporating the present invention.

Referring to FIG. 1, an electric motor 10 is energized by a polyphase AC distribution system 12 connected to a power source 14. The polyphase AC distribution system 12 has three-phase conductors 16, 18, and 20 interruptible by a switch having contacts 22, 24, and 26 connecting the power source 14 to the motor 10 through the three-phase conductors 16, 18, and 20.

A motor starter 28 includes a contactor 30 incorporating a coil 32 which when energized, closes the switching contacts 22, 24, and 26 in conductors 16, 18, and 20 to connect the motor 10 20 to the power source 14. The motor starter 28 also has an overload relay 34 to receive analog signals from a three phase sensor 36 on lines 38, 40, and 42.

The three phase sensor 36 is connected to two current transformers 44 and 46, each in operable association with two legs of the polyphase AC distribution system 12. Each of the current transformers 44, 46 include a toroidal core 44a, 46a and a secondary winding 44b, 46b, respectively. The conductors 16, 18, and 20 pass through the toroids 44a, 46a to form the primary winding of the current transformer. In the preferred embodiment of FIG. 1, conductors 16 and 18 pass through toroid 44a to form the primary winding of current transformer 44, and conductors 18 and 20 pass through toroid 46a to form the primary winding of current transformer 46. The secondary winding 44b generates analog signals representative of the currents in the associated conductors 16 and 8, and the secondary winding 46b generates analog signals representative of the currents in the associated conductors 18 and 20. The analog signals are relayed to the three phase sensor 36 via leads 44c and 46c, respectively.

In this manner, each current transformer 44 and 46 monitors two phases in the polyphase system 12 to produce a phasor representation of a sum of the two phases monitored. For example, current transformer 44 monitors phases A and B on conductors 16 and 18 and produces the phasor representation -C as a result of the vector addition. Similarly, current transformer 46 monitors phases B and C on conductors 18 and 20 to produce the phasor representation -A from the vector summation of B and C, and supplies that result on leads 46c to the three phase sensor 36.

The three phase sensor 36 is connected to each current transformer 44 and 46 for summing the phasor representations produced by each transformer and extracts a third phasor representation from the result. In this case, the three phasor sensor 36 adds the phasor representation -C from current transformer 44 to the phasor representation -A from current transformer 46 to derive the third phasor representation B. The three phase sensor 36 can then supply all three phasor representations in analog form on lines 38, 40, and 42 to analog-to-digital (A/D) convertor 48 in overload relay 34 to digitize the phasor representations.

As is known, a control or microprocessor 50 monitors an associated value of each digitized signal and when a given value exceeds some predetermined value, or the magnitudes differ by more than a predefined value, the microprocessor control 50 produces a trip signal to contactor 30 of motor starter 28 to open switching contacts 22, 24, and 26, thereby disconnecting motor 10 from power source 14. In a thermal overload application, the three phasor representations are used to compute the RMS value for the current and integrate the RMS value to create a total heat accumulation value. After subtracting a cooling factor, a net heat accumulated value is produced which can then be compared to a set point. A trip signal is produced when the net heat exceeds the set point. It is understood that the A/D converter 48 and microprocessor 50 can be equivalently replaced with a microcontroller.

Figure 2:
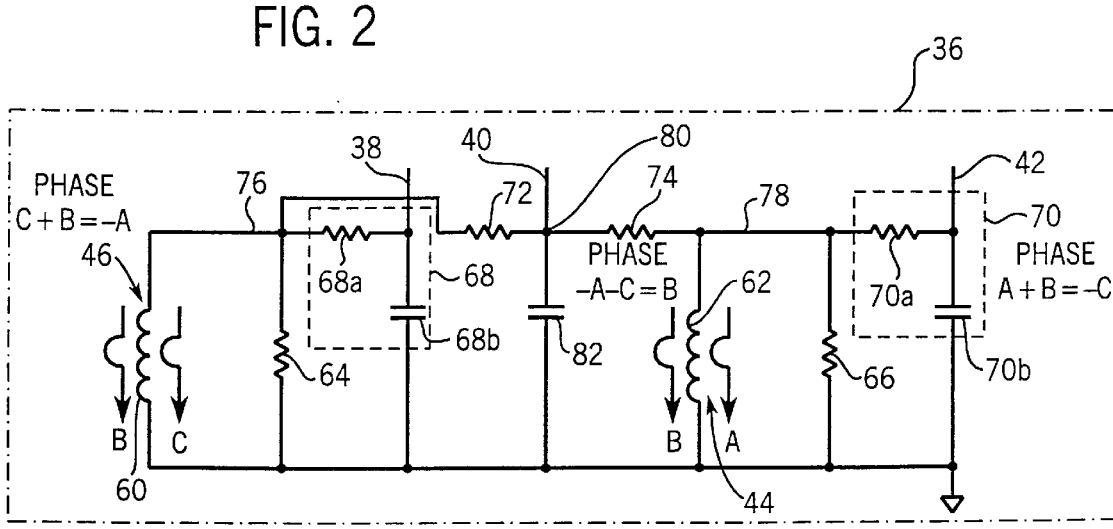
FIG. 2 is a circuit schematic of a portion of FIG. 1 in accordance with the present invention.

Referring to FIG. 2, one embodiment of the three phase sensor 36 is shown in circuit schematic form. The secondary winding of the current transformer 46 is shown as inductor 60 sensing phases B and C, and the secondary winding of the current transformer 44 is shown as inductor 62 sensing phases A and B. Burden resistors 64 and 66 are matched precision resistors connected in parallel with the secondary windings, or inductors 60 and 62, respectively. RC network 68 and 70 provide high frequency filtering and current limiting to the microcontroller. Resistors 72 and 74 are each in series with inductors 60 and 62 and form a voltage divider between the two voltage sources 76 and 78 to create a summing junction at node 80.

To provide consistent voltage levels to the microcontroller on lines 38, 40, and 42, resistors 68a and 70a are of equal value, and in a preferred embodiment, are 1.00 k ohms. The voltage divider resistors 72 and 74 are then twice the value of resistor 68a and 70a, and in this preferred embodiment are then 2.00 k ohms. Capacitor 82 provides high frequency filtering to the third phase node at 80, and is of equal value to that of capacitors 68b and 70b of RC network 68 and 70, respectively. In the preferred embodiment, capacitors 68b, 70b, and 82 are 0.01 $\mu$F.

As will be understood by those skilled in the art, the inductor 60 of current transformer 46 monitors phases B and C to provide a phase representation of -A at 76, and the inductor 62 of current transformer 44 monitors phases A and B to produce phase -C at 78. The voltage divider of resistors 72 and 74 add the phase representation -A from voltage source 76 with -C from voltage source 78 to provide phase B at summing junction 80. In this manner, all three phases are determined and supplied to the microcontroller on lines 38, 40, and 42 with the use of only two current transformers.

The invention therefore also includes a method of monitoring a polyphase distribution system. The method includes the steps of detecting current flow in each leg of a polyphase system, then creating a first phasor representation from the current flow in a first and second leg and creating a second phasor representation from the current flow in a second and third leg of the polyphase system. In using a common leg for determining the first two phasor representations, the method can then calculate a third phasor representation from the first and second phasor representations. Now that all three phasor representations have been determined, the method also includes monitoring each of the phasor representations. The step of monitoring can include preventing current flow in the polyphase system when an overload is detected in any of the phasor representations. The step of calculating can encompass the step of summing the first and second phasor representations as previously discussed.

The present invention has been thoroughly described herein as applied to a motor, a motor starter, and a thermal overload. However, it is understood that the invention is well suited for use in any polyphase distribution system and is not limited to the application described herein and shown in the drawings.

The present invention has been described in terms of the preferred embodiment and it is recognized that equivalents, alternatives, and modifications, aside from those expressly stated, are possible and within the scope of the appending claims.

We claim:

1. A device for monitoring a polyphase system connected to a load comprising:

two current transformers, each in operable association with two legs of the polyphase system wherein each current transformer monitors two phases of the polyphase system and produces a phasor representation of a sum of the two phases monitored; and a three phase sensor connected to each current transformer to sum the phasor representations produced by each current transformer and produce a third phasor representation therefrom.

2. The device of claim 1 further comprising a control connected to the three phase sensor to receive the phasor representations for each phase and produce a trip signal when a phasor representation is not within a predefined range.

3. The device of claim 2 further comprising a switch having a contact in each leg of the polyphase the control to the control to receive the trip signal and interrupt the polyphase system to the load in response thereto.

4. The device of claim 1 further comprising a control connected to the three phase sensor to receive and compare the phasor representations for each phase and produce a trip signal when the comparison exceeds a predefined range.

5. The device of claim 1 wherein the phasor representations represent a respective current in each phase and the three phase sensor creates current indicative signals for each phase, and the device further comprising a control connected to the three phase sensor to receive the current indicative signals for each phase, computes an RMS current, integrates the RMS current to calculate a net heat accumulated signal, and produces a trip signal when the net accumulated signal exceeds a set point.

6. The device of claim 1 wherein the three phase sensor comprises an adder having a two resistor voltage divider.

7. A method of monitoring a polyphase system comprising the steps of:

detecting current flow in each leg of a polyphase system;

creating a first phasor representation from the current flow in a first and second leg of the polyphase system;

creating a second phasor representation from the current flow in a second and a third leg of the polyphase system;

calculating a third phasor representation from the first and second phasor representations; and monitoring each phasor representation of the polyphase system.

8. The method of claim 7 further comprising the step of preventing current flow in each leg in response to at least one phasor representation varying by more than a predetermined value.

9. The method of claim 7 wherein the step of calculating a third phasor representation is further defined as summing the first and second phasor representations.

10. An apparatus for sensing three phases of a three phase distribution system using two current transformers comprising:

two current transformers, each in operable association with two legs of the polyphase system to each monitor two phases of the polyphase system such that each current transformer produces a phasor representation of a sum of the two phases monitored; and a three phase sensor connected to each current transformer for summing the phasor representations produced by each current transformer and producing a third phasor representation therefrom, the three phase sensor comprising a burden resistor connected in parallel with each secondary winding of the current transformers, and a voltage divider having a pair of resistors connected between each secondary winding forming a summing node to create the third phasor representation.

11. The apparatus of claim 10 wherein the three phase sensor further comprises a pair of RC networks, each connected to a secondary winding of the current transformers for high frequency filtering.

\* \* \* \* \*

UNITED STATES PATENT AND TRADEMARK OFFICE
CERTIFICATE OF CORRECTION

PATENT NO. : 5,815,357
DATED : September 29, 1998
INVENTOR(S) : Mark E. Innes, et al.

It is certified that error appears in the above-identified patent and that said Letters Patent is hereby corrected as shown below:

Column 3, line 1, after "10", delete "20";

Column 3, line 17, delete "8" and substitute therefor --18--;

IN THE CLAIMS:

Column 5, line 5, after "polyphase", insert --system connected to--; and

Column 5, line 6, delete "the control to".

Signed and Sealed this

Twenty-ninth Day of December, 1998

Attest:

BRUCE LEHMAN

*Attesting Officer*  *Commissioner of Patents and Trademarks*